(12) United States Patent
Baghschomali et al.

(10) Patent No.: US 10,309,624 B2
(45) Date of Patent: Jun. 4, 2019

(54) LIGHT-EMITTING ARRANGEMENT AND LIGHT-EMITTING SYSTEM

(71) Applicant: Jabil Optics Germany GmbH, Jena (DE)

(72) Inventors: Sepehr Baghschomali, Jena (DE); Samir Catic, Jena (DE)

(73) Assignee: Jabil Optics Germany GmbH, Jena (DE)

( * ) Notice: Subject to any disclaimer, the term of this patent is extended or adjusted under 35 U.S.C. 154(b) by 16 days.

(21) Appl. No.: 15/591,781

(22) Filed: May 10, 2017

(65) Prior Publication Data

US 2018/0187870 A1 Jul. 5, 2018

(30) Foreign Application Priority Data

Jan. 5, 2017 (DE) .................. 10 2017 100 165

(51) Int. Cl.
*F21V 19/00* (2006.01)
*F21V 17/16* (2006.01)
*F21Y 115/10* (2016.01)

(52) U.S. Cl.
CPC ............ *F21V 19/003* (2013.01); *F21V 17/16* (2013.01); *F21Y 2115/10* (2016.08)

(58) Field of Classification Search
CPC ....... F21K 9/20; F21S 4/20; F21S 4/28; F21S 43/195; F21V 19/003; F21V 23/00; F21V 23/001; F21V 23/004; F21V 23/005; F21V 23/023; F21V 23/06; F21Y 2105/10; F21Y 2115/10; H01L 2224/48137;

(Continued)

(56) References Cited

U.S. PATENT DOCUMENTS 4,428,033 A * 1/1984 McBride ................... F21L 2/00
324/506
5,440,461 A * 8/1995 Nadel .................. A41D 27/085
362/103

(Continued)

FOREIGN PATENT DOCUMENTS

CN 2474446 Y 1/2002
DE 102009022255 A1 11/2010

(Continued)

*Primary Examiner* — Hargobind S Sawhney

(74) *Attorney, Agent, or Firm* — Young Basile Hanlon & MacFarlane, P.C.

(57) ABSTRACT

Described is an arrangement and system for precise angular and directional positioning of light-emitting diodes (LED). An LED component includes a base body with a light-emitting region, a first connector, and a second connector, where the connectors are electrically conductively connected to the light-emitting region. The base body includes at least two fixing regions and the connectors each include a bending portion and a contact area for surface mounting. Each of the bending portions is arranged between the base body and the contact area. A supporting frame includes a plinth region to align the supporting frame on a surface and includes an outwardly open recess, a support region to receive a component in the supporting frame and at least two fixing elements to fix the component above the support region. A base area of the plinth region and a base area of the support region enclose an acute angle.

11 Claims, 4 Drawing Sheets

(58) Field of Classification Search
CPC ..... H01L 2224/484; H01L 2224/73265; H01L 33/36; H01L 33/48; H01L 33/52
See application file for complete search history.

(56) References Cited

U.S. PATENT DOCUMENTS

| | | | |
|---|---|---|---|
| 7,160,140 B1* | 1/2007 | Mrakovich | F21V 21/002 439/417 |
| 8,258,416 B2* | 9/2012 | Sharrah | H01H 13/64 200/1 B |
| 8,562,176 B2 | 10/2013 | Grauvogel | |
| 2003/0168583 A1* | 9/2003 | Kawabe | H01L 31/0203 250/239 |
| 2004/0201025 A1 | 10/2004 | Barnett et al. | |
| 2005/0135105 A1 | 6/2005 | Teixeira et al. | |
| 2005/0280014 A1 | 12/2005 | Park et al. | |
| 2007/0059974 A1 | 3/2007 | Chen et al. | |
| 2007/0115666 A1* | 5/2007 | Thomas | F21V 15/01 362/294 |
| 2007/0153508 A1* | 7/2007 | Nall | F21V 21/002 362/219 |
| 2008/0042164 A1* | 2/2008 | Kanschat | H01L 24/06 257/133 |
| 2008/0055915 A1* | 3/2008 | Lynch | F21V 3/04 362/373 |
| 2008/0266858 A1* | 10/2008 | Southard | G09F 9/33 362/249.01 |
| 2009/0086488 A1* | 4/2009 | Lynch | F21K 9/00 362/249.02 |
| 2009/0152081 A1* | 6/2009 | Sharrah | H01H 13/48 200/1 B |
| 2012/0175653 A1 | 7/2012 | Weber | |
| 2012/0176795 A1* | 7/2012 | Lynch | F21V 19/0055 362/249.02 |
| 2014/0268855 A1* | 9/2014 | Gerardo | B60Q 1/2615 362/520 |
| 2015/0198760 A1* | 7/2015 | Wilcox | G02B 6/0038 362/606 |

FOREIGN PATENT DOCUMENTS

| | | | |
|---|---|---|---|
| JP | 2003-264299 A | | 9/2003 |
| JP | 2008-147611 A | | 6/2008 |
| JP | 2014-503120 A | | 2/2014 |
| KR | 2008082215 A | * | 9/2008 |
| TW | M283390 U | | 12/2005 |

* cited by examiner

LIGHT-EMITTING ARRANGEMENT AND LIGHT-EMITTING SYSTEM

FIELD OF INVENTION

The present invention relates to a light-emitting arrangement and a light-emitting system. In particular, the present invention relates to an arrangement for precise angular and directional positioning of light-emitting diodes (LED) as well as a corresponding light-emitting system.

BACKGROUND

Light-emitting diodes (LEDs) are already used for a plurality of applications and, as a result, are increasingly replacing classic lighting and signaling devices. In particular, the high efficiency and the long life of LEDs compared with other lamps are decisive advantages for the automotive industry. LEDs can thereby also be arranged in very high density on curved surfaces, so that they can be used to produce spatially extended flat light sources as curved shapes.

However, since LEDs in general only emit light at a narrow beam angle (aperture angle of emission), the angle of installation of each individual LED preferably has to be adapted to the local curvature of the surface in order to achieve a uniform beam direction of the LEDs. In order to illuminate individual angular ranges in a targeted fashion it can, however, be necessary to vary the angle of installation independently of the curvature of a surface.

Complex lighting solutions, in particular inside automotive lamps, are currently being produced by placing LEDs on flex boards (as the circuit carrier) and the necessary 3D printed circuit board carriers (as the support element). Alternatively, LEDs are also welded to metal supports or inserted and then soldered by means of through-hole technology (THT) or also "pin-in-hole technology" (PIH). As a result, the necessary production expenses and the manufacturing costs of such systems are increasing significantly.

LED-based lighting systems with a variable beam direction are known, for example, from WO 2012/159744 A2 and DE 10 2011 110 580 A1. Angle-adjustable support elements for LEDs are, for example, disclosed in U.S. Pat. No. 7,897,883 B2, DE 10 2013 113 009 A1, EP 2 938 170 A1 and US 2013/0107497 A1. In these lighting systems the LEDs are electrically contacted, in each case, by means of the support element, wherein the support element is configured to align a LED which is fastened thereon at a particular angle above a circuit carrier and, at the same time, to facilitate electrical contacting between a circuit on the circuit carrier and the LED. Thus, at least two electrical contact points (between the circuit and the support element, and between the support element and LED) are configured for each of the connectors, wherein the standard requirements with respect to functionality, reliability and durability are to be placed on each of these contact points. This also results in an increase in the necessary production expenses and the manufacturing costs of such systems.

SUMMARY

It is therefore an object of the present invention to be able to adjust the beam direction of the LEDs inside an LED-based lighting system without costly constructive measures and avoiding complex assembly processes. In particular, an appropriate construction method should be compatible with a standard surface mounted technology (SMT) assembly process.

These objects are achieved according to the invention by means of the features of claims 1, 5 and 8. Expedient embodiments of the invention are contained in the respective subordinate claims.

An LED component according to the invention includes a base body having a light-emitting region; a first connector; and a second connector, wherein the connectors are electrically conductively connected to the light-emitting region; wherein the base body comprises at least two fixing regions, and the connectors each comprise a bending portion and a contact area configured for surface mounting, wherein the bending portions are each arranged between the base body and the contact areas.

The light-emitting region can, in particular, be the surface of a surface-emitting LED or the edge of an edge-emitting LED. The base body is preferably configured as a housing or cladding of the light-emitting region. One object of the base body is to protect the light-emitting region from external environmental influences and interference. The base body preferably makes it possible for the light emitted by the light-emitting region to escape. To this end, the base body can, in particular, comprise an opening or be transparent to the light emitted by the light-emitting region in the region of the light-emitting region.

In order to excite the light-emitting region electrically, an LED component according to the invention includes a first electrically conductive connector and a second electrically conductive connector, wherein the connectors are electrically conductively connected to the light-emitting region. The LED component can be excited by means of the connectors in order to emit light. The connectors preferably have a strip-type external form. The connectors are particularly preferably configured as strip-type wires.

The base body comprises at least two fixing regions, wherein a fixing region is the term used to denote a spatial region configured in the surface of the base body which, because of its structural characteristic features, is configured to facilitate a mechanically stable fixing of the base body at a fixing location. A fixing region can, for example, be a through-hole in the base body for pin or bolt mounting, an elongated groove for bracket mounting or a solder joint for mounting by means of soldering.

The fixing region is particularly preferably configured in steps by means of recesses in the surface of the base body. In this case, "in steps" means that a fixing region can be configured in particular by two stepped planes inside the surface of the base body, wherein the first stepped plane is located at a first level along a vertical axis of the base body and the second stepped plane is located at a second level greater than the first level along the vertical axis of the base body.

The connectors each have a bending portion and a contact area configured for surface mounting, wherein the bending portions are each arranged between the base body and the contact areas. A contact area is preferably a surface region which is configured for SMT surface mounting (e.g. by means of a "reflow" process). In particular, the contact areas can be configured as SMT soldered connections.

The bending portions are configured to facilitate a tilting of the base body with respect to the spatial orientation of the contact areas. The bending portions preferably comprise continuous notches running transversely to the bending direction, which reduce the thickness of the connectors locally and therefore restrict the deliberate bending of the connectors to particular portions as "nominal bending points". The contact areas can preferably be mounted in a planar manner and spatially fixed on a suitable support (e.g. a circuit carrier) by means of a SMT process, while the bending portions are freely movable (i.e. not fixed on said support) and thus the base body connected therewith can also be varied in its alignment by bending with respect to the support. The bending portions are preferably at least configured (e.g. in terms of thickness, material and/or form) such that a set bending angle is stably maintained, both in terms of time and as regards its spatial orientation.

The base body preferably comprises a square cross-section. This is particularly preferably a cross-section, the sectional plane of which lies parallel to the surface of the light-emitting region. In particular, the base body may be substantially square or cuboid.

Four periodically arranged stepped fixing regions preferably configure an octagonal border of the light-emitting region with an outer edge of the base body. In this case, periodically means that the distances of the stepped fixing regions from each other are equally large. A uniformly octagonal border of the light-emitting region is particularly preferred.

A supporting frame according to the invention for a component includes a plinth region which is configured to align the supporting frame on a surface; a support region which is configured to receive the component in the supporting frame; and at least two fixing elements which are configured to fix the component above the support region; wherein the base area of the plinth region and the base area of the support region enclose an acute angle, and the plinth region comprises an outwardly open recess.

The plinth region is preferably a support or installation region. This support or installation region can in particular have a planar configuration. The plinth region can also comprise a corresponding curvature for installation on curved (i.e. spherical) surfaces. The plinth region is particularly preferably configured such that the plinth region makes it possible to install the supporting frame on a surface so that there is no wobble or play. The plinth region is preferably configured from three or four individual base elements ("legs").

The support region is a part of the supporting frame which, due to its shape, makes it possible to receive a component in the supporting frame so that there is no wobble or play. To this end, the support region is preferably adapted to the shape of the part of the surface of the component which is in contact with the support region. The support region preferably has a planar configuration.

The component is particularly preferably an LED component according to the invention.

A supporting frame according to the invention includes at least two fixing elements which are configured to fix the component above the support region. A fixing element can preferably be a region of the supporting frame which is configured as a retaining element (e.g. including a subassembly opening or a supporting facility). In particular, fixing elements can be clamping elements which are configured to fix the component above the support region by means of clamps. The clamping elements can be flexibly supported. The clamping elements are preferably self-retaining pressure clamps. This denotes clamping elements which by means of their shape cause the clamping mechanism to open automatically when pressure is applied and which, upon reaching a certain opening position (in the case of a corresponding mating piece), spring back elastically into a clamping position and thereby clamp the element thus pressed-in (also called a snap clip).

The base area of the plinth region and the base area of the support region preferably enclose an acute angle. In this case, the term "enclose" means that the acute angle faces the support element. The term "acute angle" denotes angles between 0° and 90°. The angle is preferably greater than 10°, more preferably greater than 20° and even more preferably greater than 30°. Equally preferably, the angle is smaller than 80°, more preferably smaller than 70° and even more preferably smaller than 60°.

The outwardly open recess in the plinth region is a free volume inside the area of the plinth of the supporting frame. The recess can, for example, constitute a free space inside an otherwise solid plinth region. In this case, "outwardly open recess" means a recess arranged in the surface of the plinth region (and not, for instance, a cavity enclosed in the plinth region), wherein the recess in the plinth region is directly accessible from outside the bearing element. If the plinth region is configured by individual base elements, the recess can be defined by a free space located between the individual base elements.

The fixing elements preferably comprise lateral chamfers which encompass the support region of the supporting frame above the support region at least in sections. In this case, "encompass" means that the individual chamfers each configure a flat element, wherein the individual flat elements are each located perpendicularly on the base area of the support region and are arranged in such a way that all of the flat elements together (at least 3) define an enclosed volume region which encloses the base area of the support region at least proportionally.

A light-emitting system according to the invention includes an LED component according to the invention; a supporting frame according to the invention; and a circuit carrier; wherein the base body of the LED component rests on the support region of the supporting frame, the base body of the LED component is fixed above the support region in the region of the fixing regions by the fixing elements of the supporting frame, the connectors of the LED component are arranged at least in sections inside the recess in the plinth region of the supporting frame, and the LED component and the supporting frame are arranged on the circuit carrier.

A light-emitting system according to the invention thus constitutes an arrangement consisting of an LED component according to the invention in a supporting frame according to the invention on a corresponding circuit carrier. The circuit carrier is preferably a support body (printed circuit board) having an electrical circuit arrangement arranged thereon. The base body of the LED component rests (at least in sections) on the support region of the supporting frame.

The base body of the LED component is fixed above the support region in the region of the fixing regions by the fixing elements of the supporting frame, i.e. the fixing elements of the supporting frame interact with the fixing regions of the base body such that the LED component is supported in a fixed position inside the supporting frame.

Furthermore, the connectors of the LED component are arranged at least in sections inside the recess in the plinth region of the supporting frame. In particular, it is preferred that the portions of the connectors arranged inside the plinth region of the supporting frame do not protrude from the plinth region and are completely arranged inside the plinth region. The portions of the connectors of the LED component, which are arranged inside the recess in the plinth region of the supporting frame, are preferably the portions which include the contact areas of the connectors. The contact areas of the connectors are particularly preferably arranged inside the plinth region of the supporting frame. The contact areas of the connectors are preferably accessible through the recess in the plinth region of the supporting frame from below the plinth region.

The circuit carrier preferably comprises a plurality of LED components and supporting frames, wherein the LED components are arranged on the circuit carrier in different 3D positions with differing orientations and wherein the base area of the plinth region and the base area of the support region of the individual supporting frames enclose different angles.

In this case, "different 3D positions of the LED components" means that the individual LED components can be arranged at different positions both by means of their distance from one another (2D) as well as their height (1D) above a particular reference surface (e.g. surface of a circuit carrier). The height of the LED components can preferably be varied by means of a variation in the height of the support elements. The direction of the light emitted from the light-emitting region of a single LED component (i.e. the main beam direction of the LED component) is designated the "orientation". In particular, a different orientation of an LED component can be achieved by rotating the LED component on the surface of the circuit carrier.

The base area of the plinth region and the base area of the support region of the individual supporting frames preferably enclose different angles. As a result, the angle of the light emitted by the light-emitting region of an individual LED component can be varied with respect to the surface of a circuit carrier, in particular in the case of LED components arranged in the supporting frame.

The circuit carrier preferably has a planar configuration. In an alternative preferred embodiment, the circuit carrier can comprise a curvature. A curved circuit carrier can be a free-form element which is randomly curved in multiple directions. A circuit carrier is particularly preferably a rigid (i.e. mechanically stable) supporting body (e.g. a printed circuit board having a firmly defined form).

The idea of the present invention is that it is possible to adjust the beam direction of the light emitter, in particular inside a lighting system without elaborate constructive measures and complex assembly processes of printed circuit boards inside a lamp. A system according to the invention can be provided by using an LED component according to the invention in combination with a supporting frame according to the invention in a standard SMT assembly process. The combination of an LED component according to the invention and a supporting frame according to the invention is also designated a VAM LED ("variable angle mounted light-emitting diode").

VAM LEDs can be positioned directly on a circuit carrier, for example a circuit board, printed circuit card or a printed circuit board (PCB), and can be soldered in a "reflow" oven. Various beam directions can be achieved on a single planar carrier by means of VAM LEDs. An otherwise standard combination of multiple PCBs and the associated placement and assembly are no longer necessary. The same principle also applies in the event of an alternative use of a flex PCB on a three-dimensional holder. If multiple LEDs are wired up different beam directions can therefore already be achieved at component level (i.e. during a "preassembly" process) rather than, as is standard, during a mounting or installation process. In this case, VAM LEDs can be soldered in a conventional SMT "reflow" process, without additional assembly and installation steps.

In the case of VAM LEDs, LED components according to the invention and supporting frames according to the invention, which can be realized with different angles between the base area of the plinth region and the base area of the support region, are joined together according to a modular concept. This makes it possible to vary the beam direction. A supporting frame according to the invention therefore preferably has purely mechanical functionality. To this end, an LED component according to the invention is preferably directly electrically conductively contacted with the circuit during soldering on a printed circuit board (i.e. the circuit carrier) by means of their contact areas. Thermal and electrical coupling of the VAM LEDs is therefore exclusively achieved by means of the LED component according to the invention. The light emitter is brought into a mechanically fixed position as a result of the combination of an LED component and a supporting frame, and is therefore clearly fixed in terms of position and beam direction. In the case of a light-emitting system according to the invention, the beam direction of the individual elements can therefore be adapted in virtually any way desired.

A supporting frame according to the invention preferably consists of an electrically non-conductive material. Preferred materials are POM, PET and PTFE. A supporting frame according to the invention does not need to be exclusively used as a functional element, rather it can also be used as a design element (so-called "visible" design) by selecting virtually any material for the supporting frame. A supporting frame according to the invention preferably consists of a heat-resistant material. Materials with a permissible working temperature of up to 190° C., preferably up to 270° C., and even more preferably up to 350° C. are particularly preferred.

A supporting frame according to the invention preferably forms a rigid base body, i.e. it substantially has a mechanically stable outer shape. In particular, a supporting frame according to the invention is preferably resistant to torsion, not sensitive to pressure and temperature stable (temperatures with respect to general soldering processes). In particular, this provides a fixed installation (i.e. fixing) of an LED component according to the invention inside the supporting frame according to the invention, as well as a stable orientation of the supporting frame according to the invention on a circuit carrier (or another support surface).

Another aspect of the present invention includes a method for constructing a light-emitting arrangement, wherein the method comprises the following steps: providing an LED component according to the invention and a supporting frame according to the invention; fixing the LED component into the supporting frame, wherein the base body of the LED component is fixed above the support region of the supporting frame at the fixing regions by fixing elements of the supporting frame; and bending the connectors of the LED component, wherein the connectors are (preferably completely) arranged in the recess of the plinth region of the supporting frame.

The method indicated can preferably include the following steps: providing a circuit carrier; aligning the connectors of the LED component fixed in the supporting frame on the circuit carrier, wherein the support region of the supporting frame rests on the circuit carrier; and connecting the connectors of the LED component clamped in the supporting frame on the circuit carrier by means of a SMT process.

In the case of the indicated method, a plurality of LED components fixed in supporting frames are preferably fixed on the circuit carrier at different 3D positions with different orientations, wherein the base area of the plinth region and the base area of the support region of the individual supporting frames enclose different angles.

BRIEF DESCRIPTION OF THE DRAWINGS

The invention will be explained hereinafter in embodiment examples with reference to the accompanying drawings, wherein.

DETAILED DESCRIPTION OF THE PREFERRED EMBODIMENTS

Figure 1:
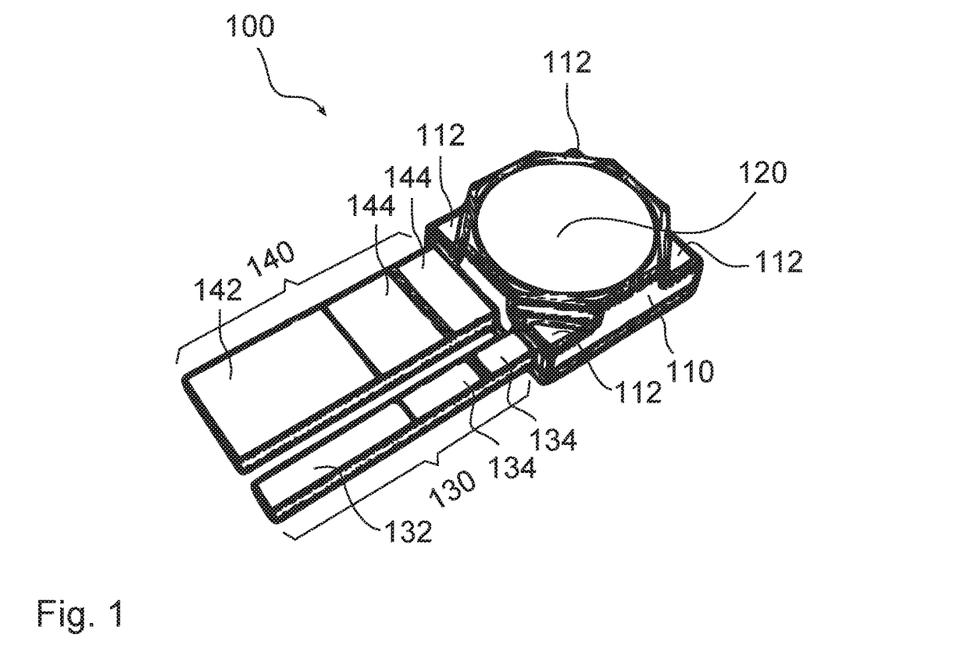
FIG. 1 shows a schematic view of an embodiment of an LED component according to the invention.

FIG. 1 shows a schematic view of an embodiment of an LED component 100 according to the invention. The LED component 100 includes a base body 110 having a light-emitting region 120, a first connector 130, and a second connector 140, wherein the connectors 130, 140 are electrically conductively connected to the light-emitting region 120, wherein the base body 110 comprises four fixing regions 112, and the connectors 130, 140 each comprise a bending portion 134, 144 (each consisting of two segments) and a contact area 132, 142 which is configured for surface mounting, wherein the bending portions 134, 144 are each arranged between the base body 110 and the contact areas 132, 142.

The base body 110 comprises a square cross-section. The fixing regions 112 are configured in a stepped form by recesses in the surface of the base body 110. In particular, four periodically arranged stepped fixing regions 112 configure an octagonal border of the light-emitting region 120 with the outer edge of the base body 110. A uniformly octagonal border of the light-emitting region 120 is shown, in which the length of the maximum extent of the stepped fixing regions 112 corresponds to the length of the adjoining border areas of the base body 110 in each case.

Figure 2:
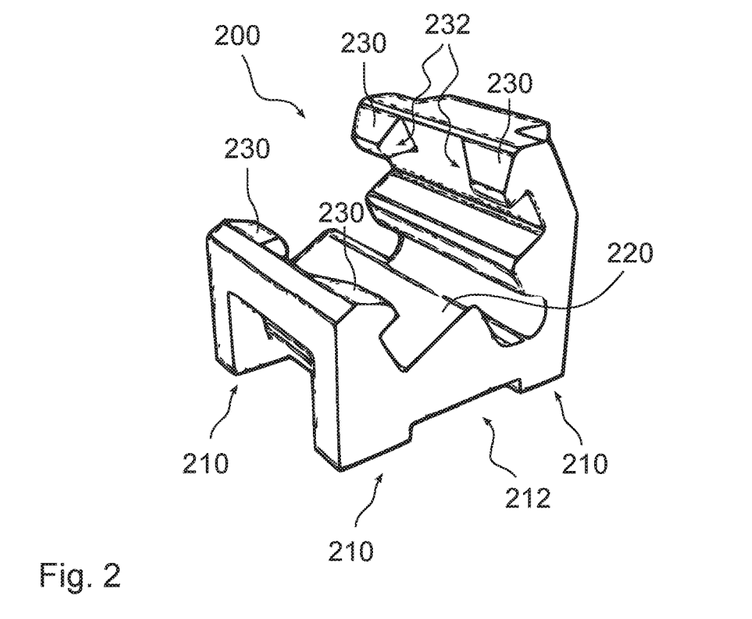
FIG. 2 shows a schematic view of a first embodiment of a supporting frame according to the invention.

FIG. 2 shows a schematic view of a first embodiment of a supporting frame 200 according to the invention. The supporting frame 200 is configured in particular to receive an LED component 100 according to the invention in accordance with the embodiment described in FIG. 1 and includes a plinth region 210 which is configured to align the supporting frame 200 on a surface; a support region 220 which is configured to receive a component in the supporting frame 200; and four fixing elements 230 which are configured to fix the component above the support region 220 in the region of the fixing regions 112 of the base body 110, wherein the base area of the plinth region 210 and the base area of the support region 220 enclose an acute angle, and the plinth region 210 comprises an outwardly open recess 212.

The fixing elements 230 are configured as clamping elements in the form of self-retaining pressure clampings. The fixing elements 230 comprise lateral chamfers 232 which include the support region 220 of the supporting frame 200 above the support region 220 at least in sections. The chamfers 232 hereby form the mating part of an octagonal border of the light-emitting region 120 of an LED component 100 according to the invention in accordance with the embodiment described in FIG. 1 with four periodically arranged stepped fixing regions 112. The chamfers 232 can constitute a guide and alignment aid when inserting such a LED component 100 according to the invention into the holding frame 200 shown, wherein preferential directions can in particular be defined for the engagement of the clamping elements.

Figure 3:
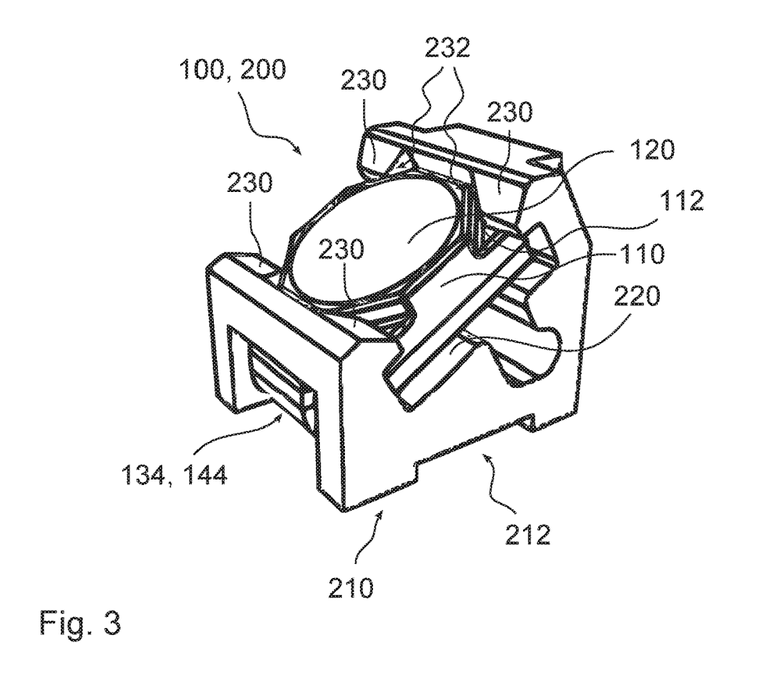
FIG. 3 shows a schematic view of an exemplary combination of an LED component according to the invention and a supporting frame according to the invention.

FIG. 3 shows a schematic view of an exemplary combination of an LED component 100 according to the invention and a supporting frame 200 according to the invention. In particular, a combination of an LED component 100 according to the invention in accordance with the embodiment according to FIG. 1 and a supporting frame 200 according to the invention in accordance with the embodiment according to FIG. 2 is shown. The individual components correspond to the representations shown in the corresponding figures, the reference numerals and the assignment thereof therefore apply accordingly. In addition, it can be inferred from FIG. 3 how the octagonal border of the light-emitting region 120 of the LED component 100 having the fixing elements 230 and the lateral chamfers 232 thereof interact with each other. The bending portions 134, 144 of the LED component make it possible to bend the respective connectors 130, 140, so that the corresponding contact areas 132, 142 can in particular be arranged completely inside the outwardly open recess 212 in the plinth region 210 of the supporting frame.

Figure 4:
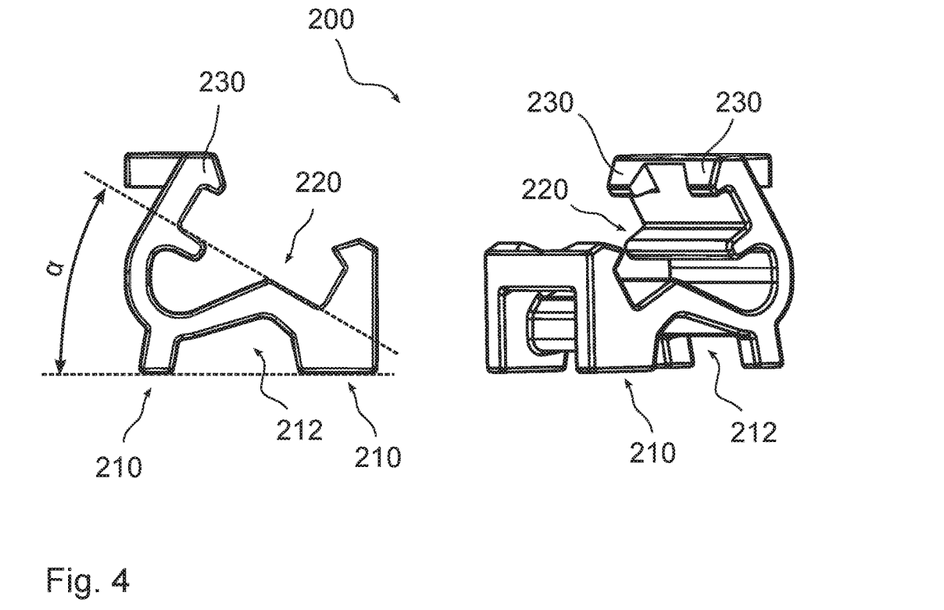
FIG. 4 shows a schematic view of a second embodiment of a supporting frame according to the invention.

FIG. 4 shows a schematic view of a second embodiment of a supporting frame 200 according to the invention. The representation shown corresponds to the greatest possible extent to the representation shown in FIG. 2, the reference numerals and the assignment thereof apply accordingly. In contrast to FIG. 2, the supporting frame shown comprises a modified shape. It can be seen in the lateral view shown that the base area of the plinth region 210 and the base area of the support region 220 enclose an acute angle (approx. 30° in the representation).

The size of the base area of the plinth region 210 of the supporting frame 200 in a preferred embodiment is approx. 3.8×3.8 mm; the height is approx. 3 mm. The size of the base area of the plinth region 210 of the supporting frame 200 is preferably less than 10 mm×10 mm, more preferably less than 5 mm×5 mm. The height is preferably less than 10 mm, preferably less than 5 mm.

Figure 5:
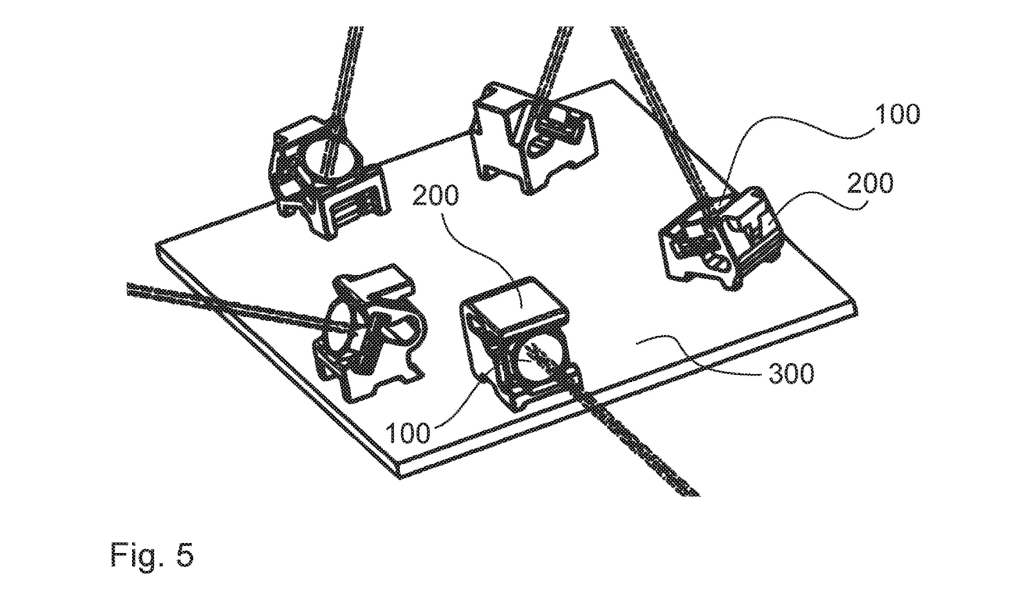
FIG. 5 shows a schematic representation of a light-emitting system according to the invention.

FIG. 5 shows a schematic representation of a light-emitting system according to the invention. The system according to the invention includes an LED component 100 according to the invention; a supporting frame 200; and a circuit carrier 300; wherein the base body 110 of the LED component 100 rests on the support region 220 of the supporting frame 200, the base body 110 of the LED component 100 is fixed above the support region 220 in the region of the fixing regions 112 by the fixing elements 230 of the supporting frame 200, the connectors 130, 140 of the LED component 100 are arranged at least in sections inside the recess 212 in the plinth region 210 of the supporting frame 200, and the LED component 100 and supporting frame 200 are arranged on the circuit carrier 300.

In addition, the light-emitting system on the circuit carrier 300, which is shown in FIG. 5, comprises a plurality of LED components 100 and supporting frames 200, wherein the LED components 100 are arranged on the circuit carrier 300 at different 3D positions with differing alignments, wherein the base area of the plinth region 210 and the base area of the support region 220 of the individual supporting frames 200 enclose different angles α.

Figure 6:
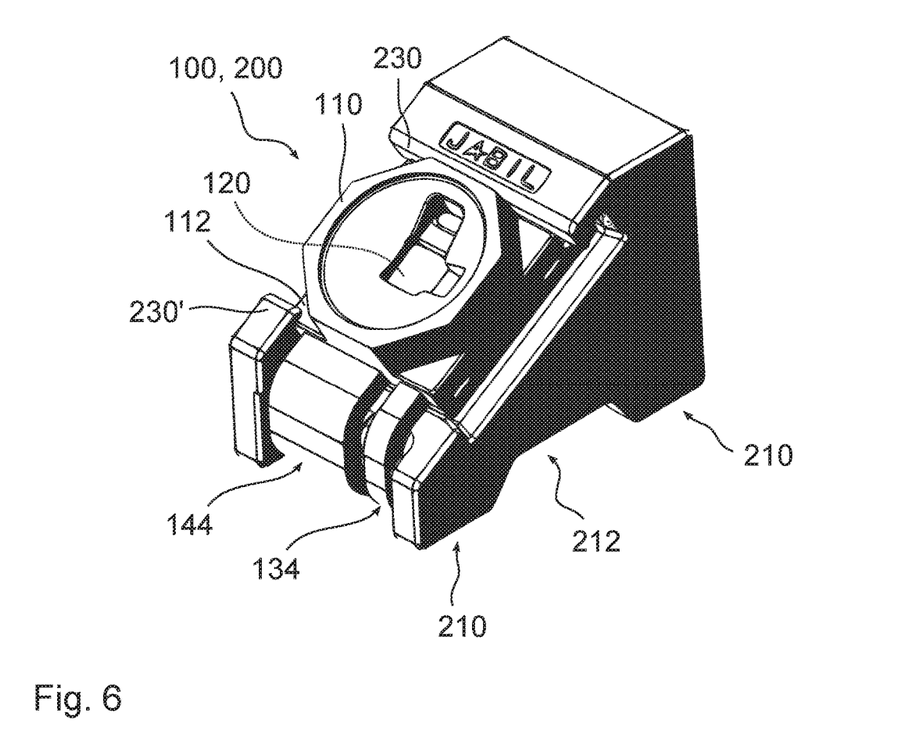
FIG. 6 shows a schematic view of another exemplary combination of an LED component according to the invention and a supporting frame according to the invention.

FIG. 6 shows a schematic view of another exemplary combination of an LED component 100 according to the invention and a supporting frame 200 according to the invention. The representation shown corresponds to the greatest possible extent to the representation shown in FIG. 3, the reference numerals and the assignment thereof apply accordingly. However, in contrast to FIG. 3, the supporting frame 200 shown comprises an alternative shape. In particular, the supporting frame 200 shown comprises two differently configured fixing elements 230, 230'. The first fixing element 230 is a pressure clamping configured in strip form, wherein the pressure clamping clamps and therefore fixes an LED component 100 according to the invention at its upper edge in the supporting frame 200. The second fixing element 230' is, on the other hand, configured as a rigid mounting, into which a fixing region 112 of the LED component 100 can be inserted. In this case, clamping can take place, but in this example it is not a pressure clamping.

The LED component 100 represented shows an octagonal border of the light-emitting region 120 (drawn in only as a position mark). Inside this border, the LED component 100 preferably comprises an emission region configured as a reflector. The emission region can, as shown, in particular configure a concave form with respect to the corresponding surface area of the LED component 100. The emission region is preferably mirrored and configured such that radiation emitted in a divergent manner by the light-emitting region 120 is concentrated into a common beam direction. The light-emitting region 120 is not explicitly shown in FIG. 6. Rather, an open reception region for installing a LED chip configuring the light-emitting region 120 is drawn in at this position in order to explain the internal structure 120. The two connectors 130, 140 of the LED component 100 are electrically conductively guided up to the reception region, so that direct electrical contacting of the LED chip and therefore of the light-emitting region 120 is made possible. The light-emitting region 120 is preferably located in the center of the emission region or centrally inside the octagonal border of the light-emitting region 120. The LED chip of a LED component 100 according to the invention is preferably interchangeable.

LIST OF REFERENCE NUMERALS

100 LED component
110 Base body
112 Fixing regions
120 Light-emitting region
130 First connector
132 Contact area (first connector)
134 Bending portion (first connector)
140 Second connector
142 Contact area (second connector)
144 Bending portion (second connector)
200 Supporting frame
210 Plinth region
212 Recess
220 Support region
230, 230' Fixing elements
232 Lateral chamfers
300 Circuit carrier
α Angle

What is claimed is:

1. A light-emitting system, comprising:
an LED component comprising:
a base body having a light-emitting region and comprising at least two fixing regions;
a first connector comprising a bending portion and a contact area configured for surface mounting, wherein the bending portion of the first connector is arranged between the base body and the contact area of the first connector;
a second connector comprising a bending portion and a contact area configured for surface mounting, wherein the bending portion of the second connector is arranged between the base body and the contact area of the second connector;
wherein the first connector and the second connector are electrically conductively connected to the light-emitting region;
a supporting frame comprising:
a plinth region which is configured to align the supporting frame on a surface, wherein the plinth region comprises an outwardly open recess;
a support region which is configured to receive a component in the supporting frame; and
at least two fixing elements which are configured to fix the component above the support region,
wherein a base area of the plinth region and a base area of the support region enclose an acute angle; and
a circuit carrier,
wherein the base body of the LED component rests on the support region of the supporting frame,
wherein the base body of the LED component is fixed above the support region in the region of the at least two fixing regions by the fixing elements of the supporting frame,
wherein the first connector and the second connector of the LED component are arranged at least in sections inside the recess in the plinth region of the supporting frame, and
wherein the LED component and the supporting frame are arranged on the circuit carrier.

2. The system according to claim 1, wherein the circuit carrier comprises a plurality of LED components and supporting frames, wherein the LED components are arranged on the circuit carrier at various 3D positions at differing alignments, wherein the base area of the plinth region and the base area of the support region of the individual supporting frames enclose different angles (α).

3. The system according to claim 1, wherein the circuit carrier comprises a curvature.

4. The system according to claim 1, wherein the base body comprises a square cross-section.

5. The system according to claim 4, wherein the at least two fixing regions are configured in steps by recesses in the surface of the base body.

6. The system according to claim 4, wherein the fixing elements are configured as self-retaining pressure clamps.

7. The system according to claim 6, wherein the fixing elements comprise lateral chamfers, which include the support region of the supporting frame above the support region at least in sections.

8. The system according to claim 7, wherein the at least two fixing regions are configured in steps by recesses in the surface of the base body.

9. The system according to claim 1, wherein the at least two fixing regions are configured in steps by recesses in the surface of the base body.

10. The system according to claim 1, wherein the fixing elements are configured as self-retaining pressure clamps.

11. The system according to claim 1, wherein the fixing elements comprise lateral chamfers, which include the support region of the supporting frame above the support region at least in sections.

* * * * *